United States Patent
Vaartstra et al.

(10) Patent No.: US 6,445,023 B1
(45) Date of Patent: Sep. 3, 2002

(54) MIXED METAL NITRIDE AND BORIDE BARRIER LAYERS

(75) Inventors: Brian A. Vaartstra, Nampa; Donald L. Westmoreland, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/268,326

(22) Filed: Mar. 16, 1999

(51) Int. Cl.[7] .................. H01L 27/108; H01L 29/76; H01L 29/94; H01L 31/119
(52) U.S. Cl. .................. 257/295; 257/306; 257/308
(58) Field of Search .................. 257/295–310; 438/253–254, 396–399

(56) References Cited

U.S. PATENT DOCUMENTS

| | | |
|---|---|---|
| 5,142,438 A | 8/1992 | Reinberg et al. |
| 5,187,638 A | 2/1993 | Sandhu et al. |
| 5,198,386 A | 3/1993 | Gonzalez |
| 5,290,588 A * | 3/1994 | Romero et al. ............. 427/123 |
| 5,362,632 A | 11/1994 | Mathews |
| 5,406,447 A | 4/1995 | Miyazaki |
| 5,464,786 A | 11/1995 | Figura et al. |
| 5,478,772 A | 12/1995 | Fazan |
| 5,489,548 A * | 2/1996 | Nishioka et al. ............ 438/396 |
| 5,498,562 A | 3/1996 | Dennison et al. |
| 5,504,041 A | 4/1996 | Summerfelt |
| 5,506,166 A | 4/1996 | Sandhu et al. |
| 5,567,964 A | 10/1996 | Kashihara et al. |
| 5,568,352 A | 10/1996 | Hwang |
| 5,585,300 A | 12/1996 | Summerfelt |
| 5,605,857 A | 2/1997 | Jost et al. |
| 5,654,222 A | 8/1997 | Sandhu et al. |
| 5,654,224 A | 8/1997 | Figura et al. |
| 5,663,088 A | 9/1997 | Sandhu et al. |
| 5,665,628 A | 9/1997 | Summerfelt |
| 5,679,980 A | 10/1997 | Summerfelt |
| 5,686,339 A | 11/1997 | Lee et al. |
| 5,688,724 A | 11/1997 | Yoon et al. |
| 5,690,727 A | 11/1997 | Azuma et al. |
| 5,696,018 A | 12/1997 | Summerfelt et al. |
| 5,717,250 A | 2/1998 | Schuele et al. |
| 5,760,474 A | 6/1998 | Schuele |
| 5,933,365 A * | 8/1999 | Klersy et al. .................. 257/5 |
| 6,090,697 A * | 7/2000 | Xing et al. |

OTHER PUBLICATIONS

Matsuhashi et al., *Optimum Electrode Materials for $Ta_2O_3$ Capacitors at High and Low Temperature Processes*, Extended Abstract of the 1993 International Conference on Solid State Devices and Materials, Makuhari, 1993, pp. 853–855.

Kwon, et al., *Degradation–Free $Ta_2O_5$ Capacitor after BPSG Reflow at 850° C for High Density DRAMs*, IEEE, 1993, pp. 53–56.

Shappirio, et al., *Diboride Diffusion Barriers in Silicon and GaAs Technology*, J. Vac. Sci. Technol. B, vol. 4, No. 6, Nov./Dec. 1986, pp. 1409–1415.

Rebhoiz, et al., *Structure, Mechanical and Tribological Properties of Ti–B–N and Ti–Al–B–N Multiphase Thin Films Produced by Electron–Beam Evaporation*, J. Vac. Sci. Technol. A 16(5), Sep./Oct. 1998, pp. 2850–2857.

* cited by examiner

Primary Examiner—Tom Thomas
Assistant Examiner—Cuong Quang Nguyen
(74) Attorney, Agent, or Firm—Dickstein Shapiro Morin & Oshinsky LLP

(57) ABSTRACT

Mixed metal aluminum nitride and boride diffusion barriers and electrodes for integrated circuits, particularly for DRAM cell capacitors. Also provided are methods for CVD deposition of $M_xAl_yN_zB_w$ alloy diffusion barriers, wherein M is Ti, Zr, Hf, V, Nb, Ta, Cr, Mo, or W; x is greater than zero; y is greater than or equal to zero; the sum of z and w is greater than zero; and wherein when y is zero, z and w are both greater than zero.

41 Claims, 16 Drawing Sheets

MIXED METAL NITRIDE AND BORIDE BARRIER LAYERS

FIELD OF THE INVENTION

The invention relates generally to integrated circuits and more particularly to the use of amorphous ternary aluminum nitride and boride alloy materials for diffusion barrier layers in such circuits.

BACKGROUND OF THE INVENTION

In semiconductor devices, it is common for the design to require interfaces of silicon and a metal such as aluminum or tungsten. For example, aluminum and tungsten are commonly used as the material of choice for electrical contacts, which contacts interface with electrically active areas made of doped silicon. It is also common in the fabrication of semiconductor devices to anneal the devices at elevated temperatures, such as 500° C. At these temperatures, the metal and silicon will rapidly interdiffuse into each other at the interface. Even at room temperature, the metal and silicon will interdiffuse over time. Such interdiffusion changes the semiconductive properties of the silicon and causes defective devices.

Capacitors are used in a wide variety of integrated circuits and present special interdiffusion concerns. Capacitors are of particular concern in DRAM (dynamic random access memory) circuits. The electrodes in a DRAM cell capacitor must protect the dielectric film (e.g., $Ta_2O_5$ and (Ba,Sr)$TiO_3$) from interaction with surrounding materials and from the harsh thermal processing encountered in subsequent steps of DRAM process flow. In order to function well as a bottom electrode, the electrode film or film stack must act as an effective barrier to the diffusion of oxygen and silicon. Oxidation of the underlying Si results in decreased series capacitance, thus degrading the capacitor.

It is common practice to provide diffusion barriers in semiconductor devices. A thin film of titanium nitride (TiN) or titanium tungsten (TiW) is conventionally used as diffusion barrier. Conventional barrier materials, however, tend to be polycrystalline with grain boundaries through which diffusion of Si and O atomic species can occur.

The conventional diffusion barriers for silicon/metal interfaces and capacitor dielectrics, while generally relatively effective at room temperature, can fail at more elevated temperatures. Many preferred semiconductor fabrication processes, such as deposition, reflow, and annealing, require elevated temperatures. Thus conventional diffusion barriers can create limits on the processes that can be used to fabricate a semiconductor device. There is a need for a diffusion barrier that is more effective than conventional polycrystalline barriers, especially at elevated temperatures.

What is needed are improved diffusion barrier layers and fabrication methods that offer a combination of good conformality, high conductivity, and excellent barrier properties for protecting against interdiffusion at capacitor dielectrics and silicon/metal interfaces in semiconductor devices, particularly during high temperature fabrication processes.

SUMMARY OF THE INVENTION

The present invention provides mixed-metal nitride, boride and boride-nitride alloy barrier layers of the formula $M_xAl_yN_zB_w$, wherein M is Ti, Zr, Hf, V, Nb, Ta, Cr, Mo, or W; x is greater than zero; y is greater than or equal to zero; the sum of z and w is greater than zero; and wherein when y is zero, z and w are both greater than zero, and when M is Ti, w is greater than 0.

The preferred metals (M) are Ti, Zr, Hf, Ta, Nb, Mo and W. Preferably, when M is Ti, Zr, Hf, Ta, or Nb, x+y=1, and z+w/2=1; and when M is Mo or W, x+y=1, and z+2w=1. Most preferably, M is Ti, Zr, Hf, Ta, or Nb and $M_xAl_yN_zB_w$ has the formula $M_{0.7}Al_{0.3}N_{0.3}B_{1.4}$, or M is Mo, or W, and $M_xAl_yN_zB_w$ has the formula $M_{0.7}Al_{0.3}N_{0.3}B_{0.35}$.

The invention also provides semiconductor capacitors fabricating capacitors and other devices containing $M_xAl_yN_zB_w$ barrier layers in order to protect capacitor cell dielectrics, such as $SiO_2$, $Ta_2O_5$, $SrTiO_3$ ("ST"), (Ba,Sr)$TiO_3$ ("BST"), Pb(Z,Ti)$O_3$ ("PZT"),$SrBi_2Ta_2O_9$("SBT") and Ba(Zr,Ti)$O_3$ ("BZT").

The mixed-metal nitride and boride layers of the invention provide excellent barrier protection, conductivity as capacitor electrodes, and conformality, and so may be employed either as capacitor electrodes, or as separate barrier layers formed adjacent to conventional capacitor electrodes, either atop these electrodes or interposed between the electrode and the capacitor dielectric. Preferably, the $M_xAl_yN_zB_w$ layer according to the invention comprises a thin barrier film between a cell dielectric and an underlying polysilicon (poly) plug or drain in a DRAM cell array, as well as acting as a lower electrode.

The barrier layers and methods of the invention are also useful in any device containing a Si/metal interface, and any other semiconductor device where protection against degradation through diffusion and thermal effects is desired.

DETAILED DESCRIPTION OF THE PREFERRED EMBODIMENTS

The mixed metal boride, nitride, and boride-nitride barrier materials of the invention generally have the formula $M_xAl_yN_zB_w$, wherein M is Ti, Zr, Hf, V, Nb, Ta, Cr, Mo or W, and x, y, z, and w are any suitable value such that x is greater than zero; y is greater than or equal to zero; the sum of z and w is greater than zero; and wherein when y is zero, z and w are both greater than zero, and when M is Ti, w is greater than 0. The preferred metals ("M") are Ti, Zr, Hf, Ta, Nb, Mo and W. Preferably, when M is Ti, Zr, Hf, Ta, or Nb, x+y=1, and z+w/2=1, and when M is Mo or W, x+y=1, and z+2w=1. Most preferably, M is Ti, Zr, Hf, Ta, or Nb and $M_xAl_yN_zB_w$ has the formula $M_{0.7}Al_{0.3}N_{0.3}B_{1.4}$, or M is Mo, or W, and $M_xAl_yN_zB_w$ has the formula $M_{0.7}Al_{0.3}N_{0.3}B_{0.35}$.

The $M_xAl_yN_zB_w$ barrier material can be deposited by a sputter process from metal nitride and metal boride targets, or sputtered from metal targets in the presence of boron and nitrogen containing gases, such as diborane, ammonia and nitrogen. The barrier material can also be deposited by chemical vapor deposition utilizing a volatile source for M and Al and a reactive gas source for N and B. Examples of metal sources for Al deposition include, such as, dimethylaluminumhydride (DMAH) and triethylaluminum (TEAL). Sources for M include any metal halide or organometallic compound suitable for a CVD process. The $M_xAl_yN_zB_w$ barrier material can also be deposited by liquid spin-on or dip coat processes utilizing a metalorganic solution that is baked and annealed after application. Chemical vapor deposition techniques are preferred, because they generally are more suitable for deposition on semiconductor substrates or substrate assemblies, particularly in contact openings which are extremely small and require conformally filled layers.

The methods of the present invention can be used to deposit a barrier material film on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. Metal and other components of the barrier film may be deposited from either a volatile liquid, a sublimable solid, or a solid that is soluble in a suitable solvent that is not detrimental to the substrate, and other layers thereon. Preferably, however, solvents are not used; rather, the metal components are liquid and used neat. Methods of the present invention preferably utilize vapor deposition techniques, such as flash vaporization, bubbling, etc.

Figure 1:
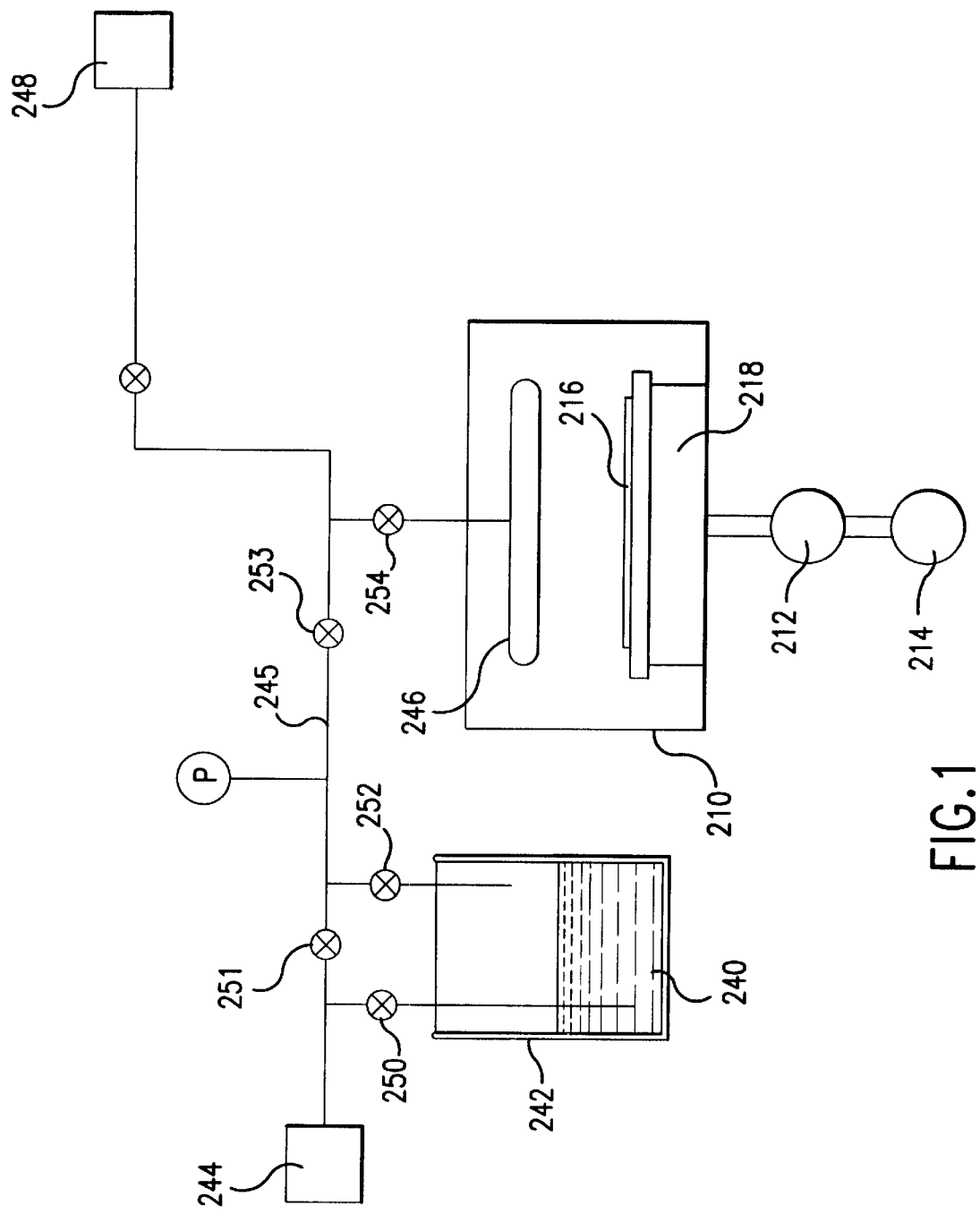
FIG. 1 is a schematic of a chemical vapor deposition system suitable for use in the method of the present invention.

A typical chemical vapor deposition (CVD) system that can be used to perform the process of the present invention is shown in FIG. 1. The system includes an enclosed chemical vapor deposition chamber 210, which may be a cold wall-type CVD reactor. As is conventional, the CVD process may be carried out at pressures of from atmospheric pressure down to about $10^{-3}$ torr, and preferably from about 10 torr to about 0.1 torr. A vacuum may be created in chamber 210 using turbo pump 212 and backing pump 214.

One or more substrates 216 (e.g., semiconductor substrates or substrate assemblies) are positioned in chamber 210. A constant nominal temperature is established for the substrate, preferably at a temperature of about 100° C. to about 600° C., and more preferably at a temperature of about 250° C. to about 550° C. Substrate 216 may be heated, for example, by an electrical resistance heater 218 on which substrate 216 is mounted. Other known methods of heating the substrate may also be utilized.

In this process, the precursor composition 240, which contains one or more metal or metalloid complexes, is stored in liquid form (a neat liquid at room temperature or at an elevated temperature if solid at room temperature) in vessel 242. A source 244 of a suitable inert gas is pumped into vessel 242 and bubbled through the neat liquid (i.e., without solvent) picking up the precursor composition and carrying it into chamber 210 through line 245 and gas distributor 246. Additional inert carrier gas or reaction gas may be supplied from source 248 as needed to provide the desired concentration of precursor composition and regulate the uniformity of the deposition across the surface of substrate 216. As shown, a series of valves 250–254 are opened and closed as required.

Generally, the precursor composition is pumped into the CVD chamber 210 at a flow rate of about 1 sccm (standard cubic centimeters) to about 1000 sccm. The semiconductor substrate is exposed to the precursor composition at a pressure of about 0.001 torr to about 100 torr for a time of about 0.01 minute to about 100 minutes. In chamber 210, the precursor composition will form an adsorbed layer on the surface of the substrate 216. As the deposition rate is temperature dependent, increasing the temperature of the substrate will increase the rate of deposition. Typical deposition rates are about 10 Angstroms/minute to about 1000 Angstroms/minute. The carrier gas containing the precursor composition is terminated by closing valve 253.

Figure 2:
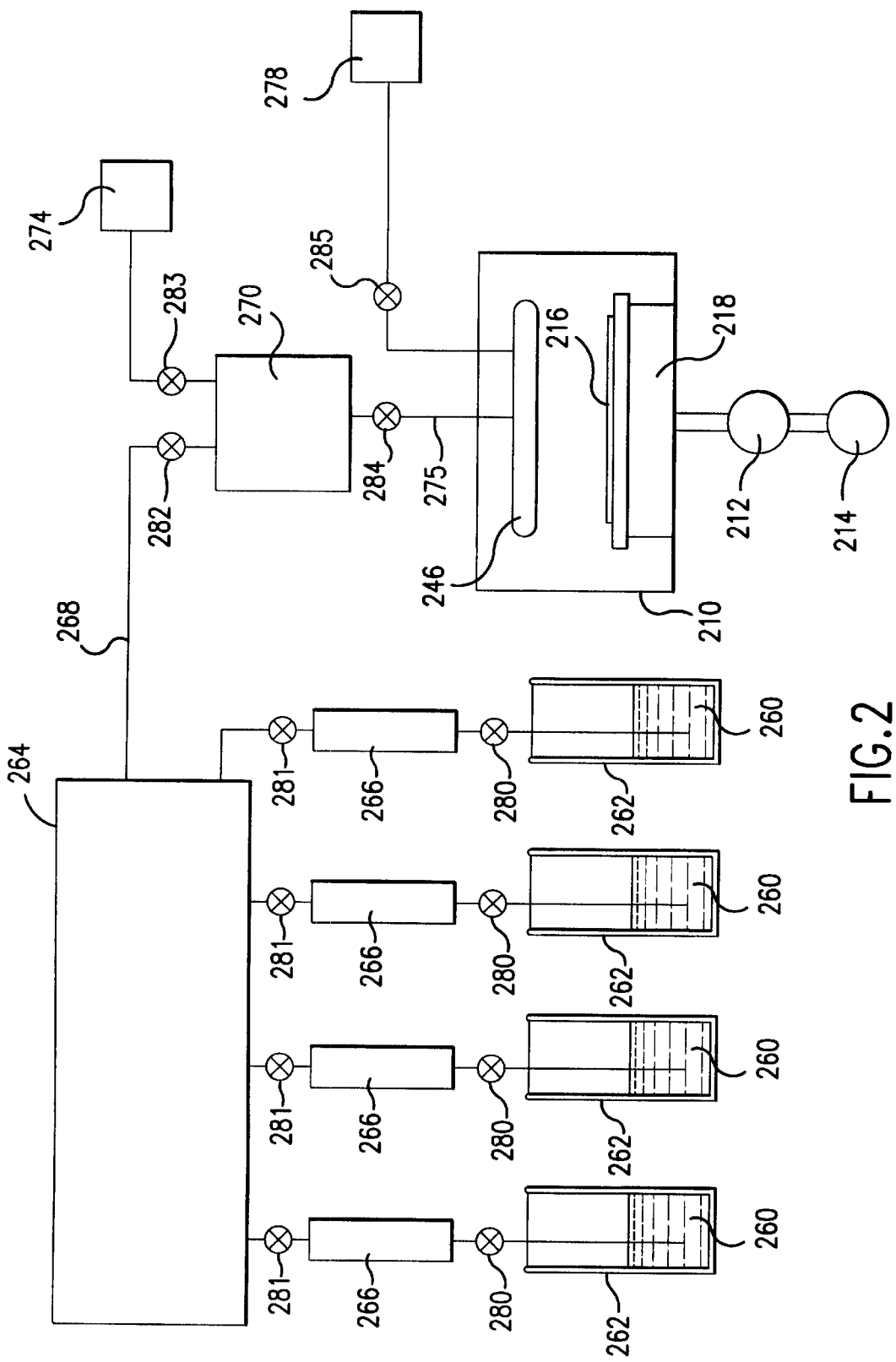
FIG. 2 is a schematic of an alternative chemical vapor deposition system suitable for use in the method of the present invention.

An alternative CVD system that can be used to perform the mixed metal nitride and boride CVD process of the present invention is shown in FIG. 2. The system includes an enclosed chemical vapor deposition chamber 210, which may be a cold wall-type CVD reactor, in which a vacuum may be created using turbo pump 212 and backing pump 214. One or more substrates 216 (e.g., semiconductor substrates or substrate assemblies) are positioned in chamber 210. Substrate 216 may be heated as described with reference to FIG. 1 (for example, by an electrical resistance heater 218).

In this process, one or more solutions 260 of one or more precursor metal or metalloid complexes are stored in vessels 262. The solutions are transferred to a mixing manifold 264 using pumps 266. The resultant precursor compositions containing one or more precursor complexes and one or more organic solvents is then transferred along line 268 to vaporizer 270, to volatilize the precursor composition. A source 274 of a suitable inert gas is pumped into vaporizer 270 for carrying a volatilized precursor composition into chamber 210 through line 275 and gas distributor 276. Reaction gas may be supplied from source 278 as needed. As shown, a series of valves 280–285 are opened and closed as required. Similar pressures and temperatures to those described with reference to FIG. 1 can be used.

Various combinations of carrier gases and/or reaction gases can be used in certain methods of the present invention. They can be introduced into the chemical vapor deposition chamber in a variety of manners, such as directly into the vaporization chamber or in combination with the precursor composition. Although specific vapor deposition processes are described by reference to FIGS. 1–2, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors.

The use of the mixed metal nitride and boride materials and methods of forming layers and films of the present invention are beneficial for a wide variety of applications in semiconductor structures, particularly those using high dielectric materials or ferroelectric materials. Such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices, and any semiconductor device having a silicon-metal interface.

Examples of fabrication processes for capacitors and other semiconductor devices containing mixed metal nitride, boride and nitride-boride barrier layers of the formula $M_xAl_yN_zB_w$ are described below. It is to be understood, however, that these processes are only examples of many possible configurations and processes utilizing the barriers or electrodes of the invention. For example, in the DRAM cell stacked container capacitor process described next, a mixed metal nitride and boride material is utilized as a barrier below the bottom electrode of a capacitor. Alternatively, the top electrode may also include a barrier material. The invention is not intended to be limited by the particular processes described below.

Figure 3:
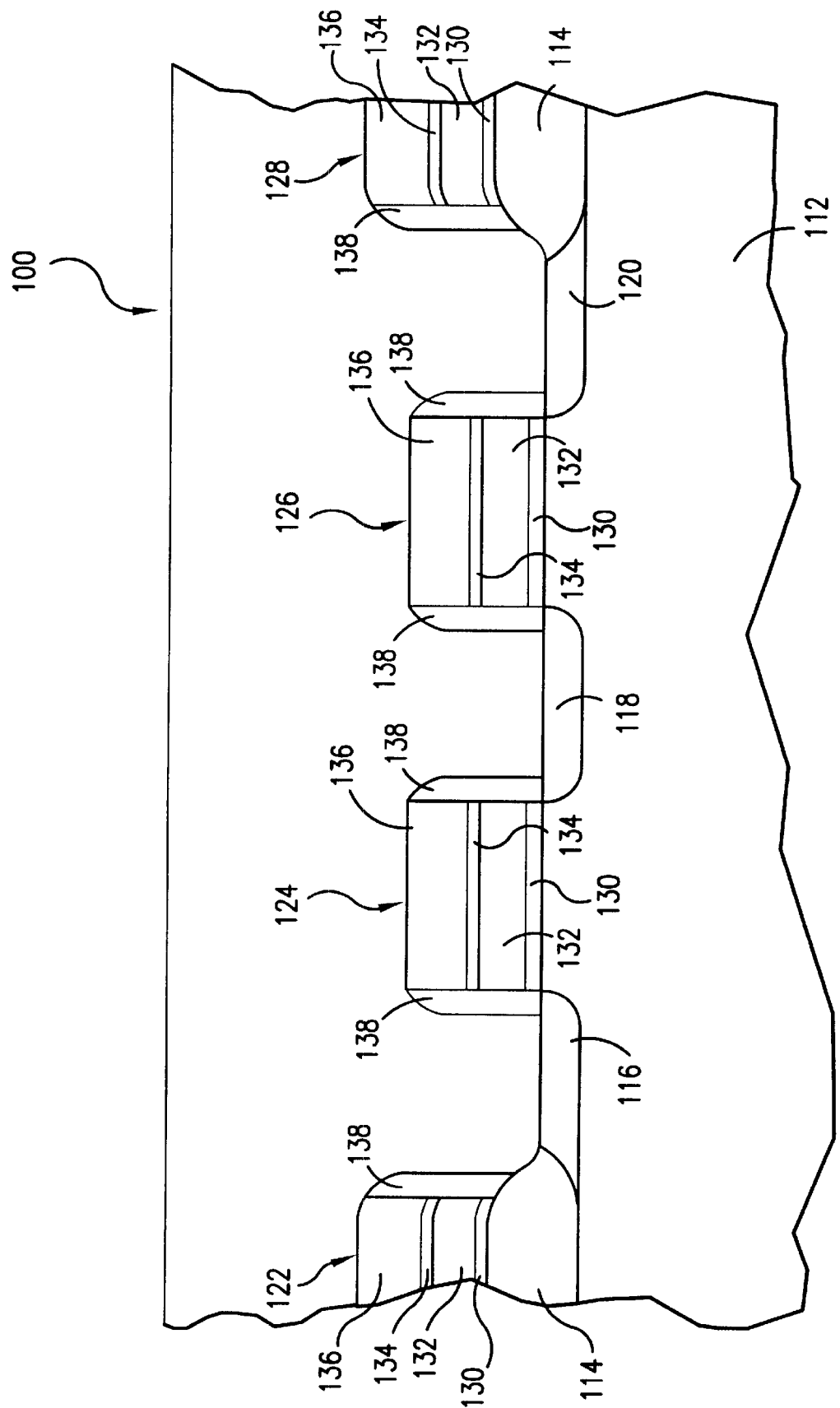
FIG. 3 is a diagrammatic cross-sectional view taken along a portion of a semiconductor wafer at an early processing step according to one embodiment of the present invention.

Referring to FIG. 3, a typical semiconductor wafer fragment at an early processing step is indicated generally by reference numeral 100. The semiconductor wafer 100 is comprised of a bulk silicon substrate 112 with field isolation oxide regions 114 and active areas 116, 118, 120. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, also of silicon nitride.

Two FETs are depicted in FIG. 3. One FET is comprised of two active areas (source/drain) 116, 118 and one word line (gate) 124. The second FET is comprised of two active areas (source/drain) 118, 120 and a second word line (gate) 126. The active area 118 common to both FETs is the active area over which a bit line contact will be formed.

Figure 4:
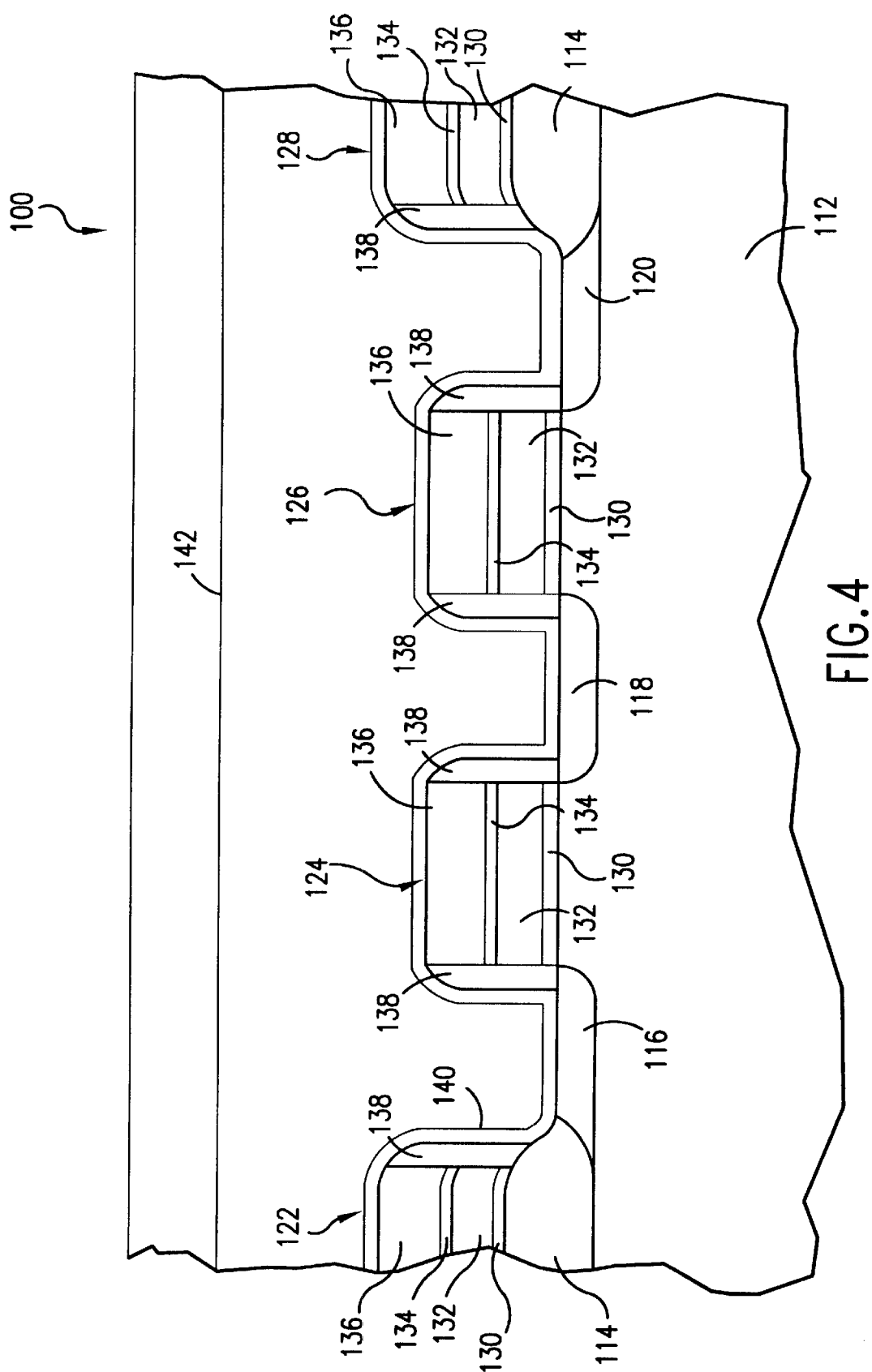
FIG. 4 is a diagrammatic cross-sectional view of a portion of a semiconductor wafer at a processing step subsequent to that shown in FIG. 3.

Referring to FIG. 4, a thin layer 140 of nitride or TEOS is provided atop the wafer 100. Next a layer of insulating material 142 is deposited. The insulating material preferably consists of borophosphosilicate glass (BPSG). The insulating layer 142 is subsequently planarized by chemical-mechanical polishing (CMP).

Figure 5:
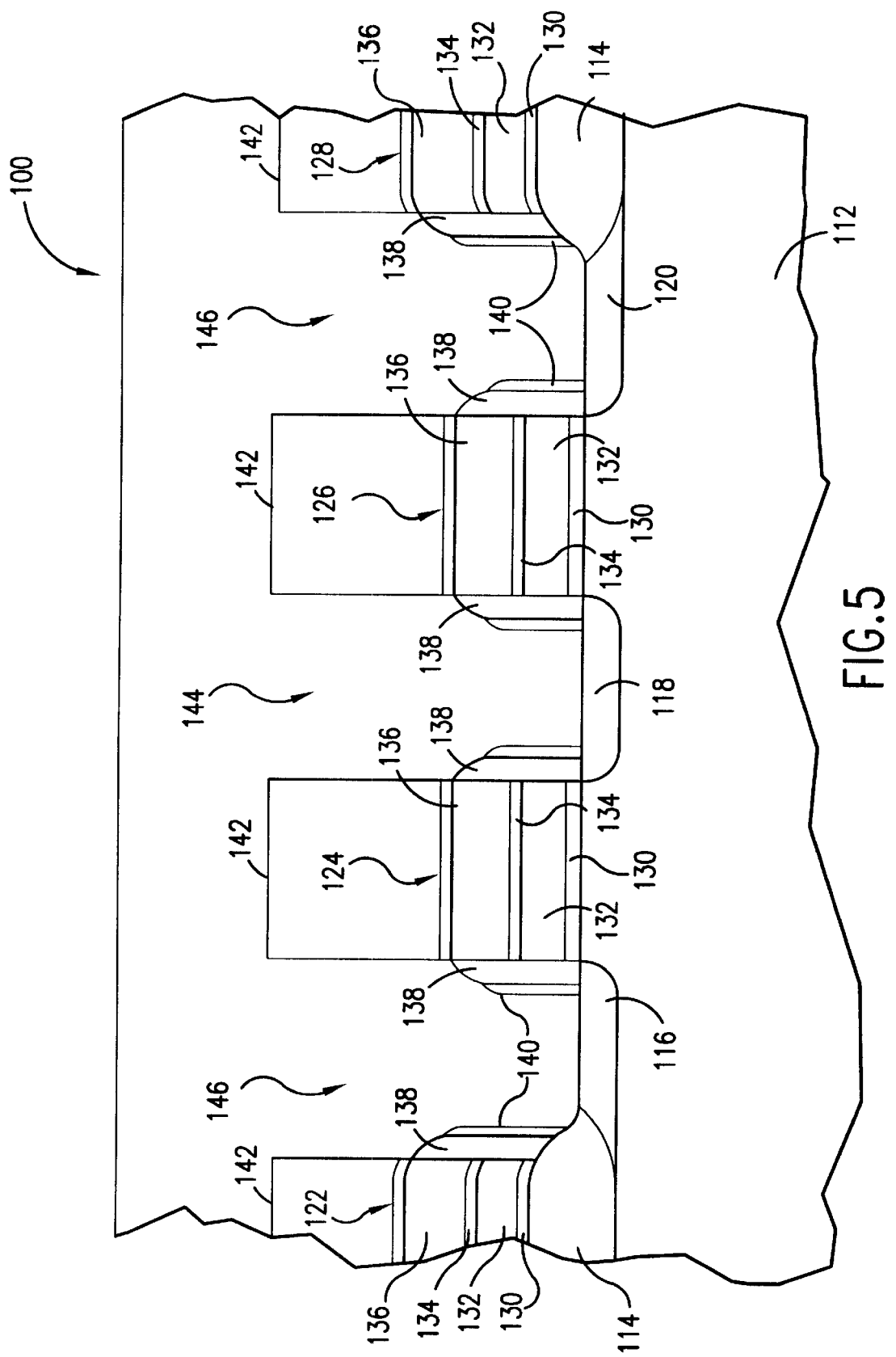
FIG. 5 is a diagrammatic cross-sectional view of a portion of a semiconductor wafer at a processing step subsequent to that shown in FIG. 4.
Figure 6:
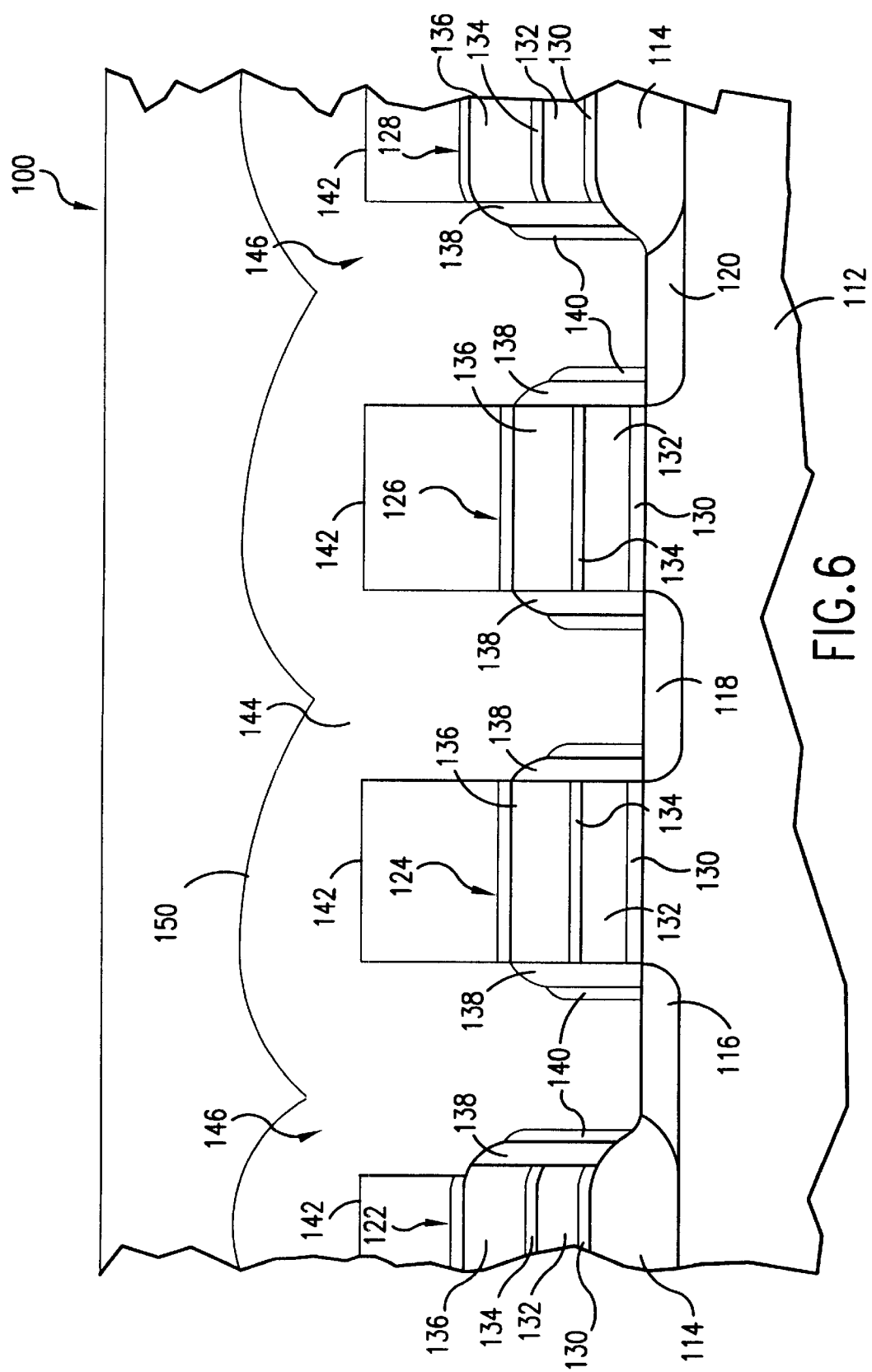
FIG. 6 is a diagrammatic cross-sectional view of a portion of a semiconductor wafer at a processing step subsequent to that shown in FIG. 5.
Figure 7:
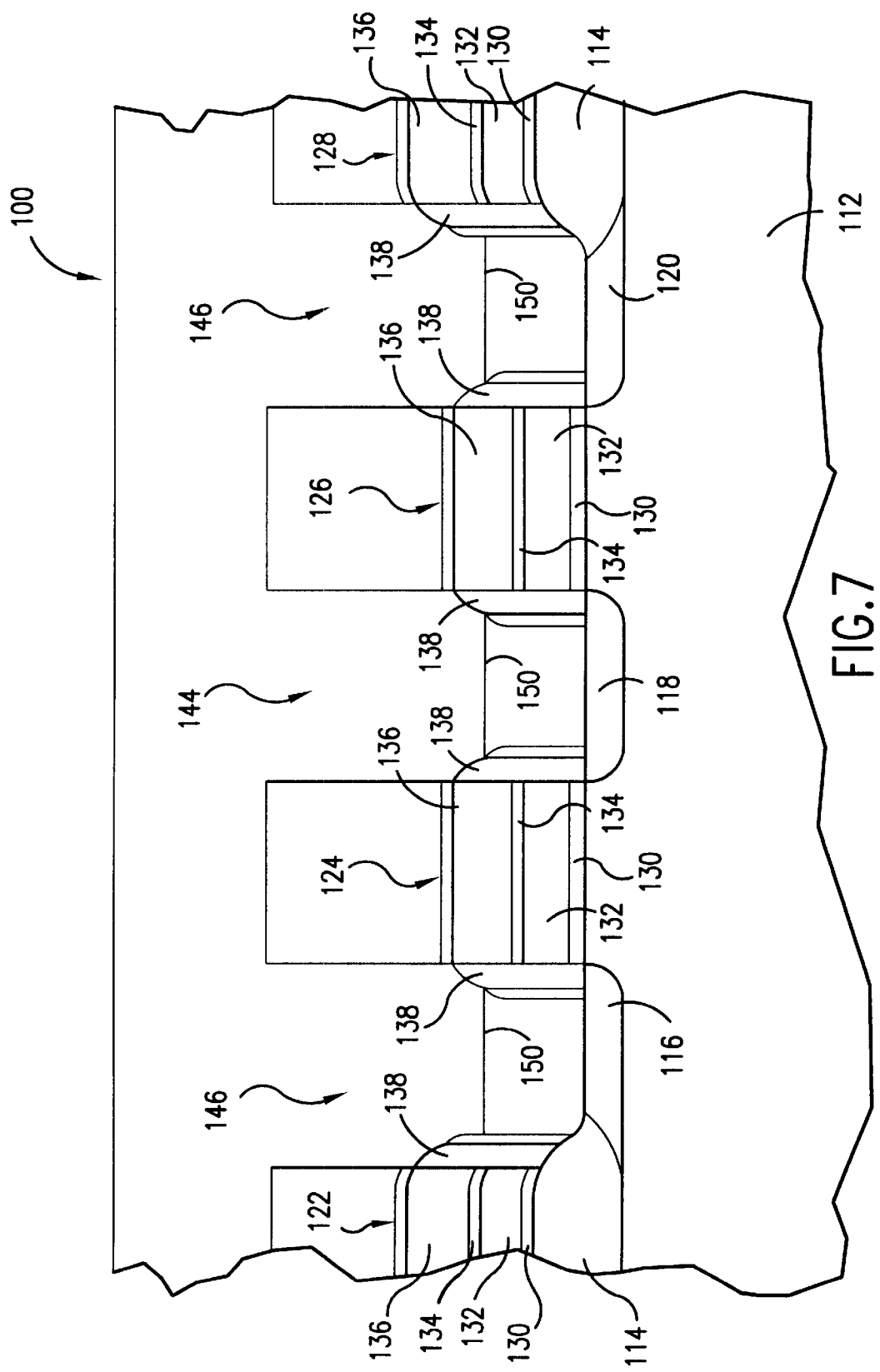
FIG. 7 is a diagrammatic cross-sectional view of a portion of a semiconductor wafer at a processing step subsequent to that shown in FIG. 6.

Referring to FIG. 5, a bit line contact opening 144 and capacitor openings 146 have been formed through the insulating layer 142. The openings 144, 146 are formed through the insulating layer 142 by photomasking and dry chemical etching the BPSG relative to the thin nitride or TEOS layer 140. Referring now to FIG. 6, a layer 150 of conductive material is deposited to provide conductive material within the bit line contact and capacitor openings 144, 146. The conductive layer 150 is in contact with the active areas 116, 118, 120. An example of the material used to form layer 150 is in situ arsenic or phosphorous doped poly. Referring now to FIG. 7, the conductive layer 150 is etched away to the point that the only remaining material forms plugs 150 over the active areas 116, 118, 120.

Figure 8:
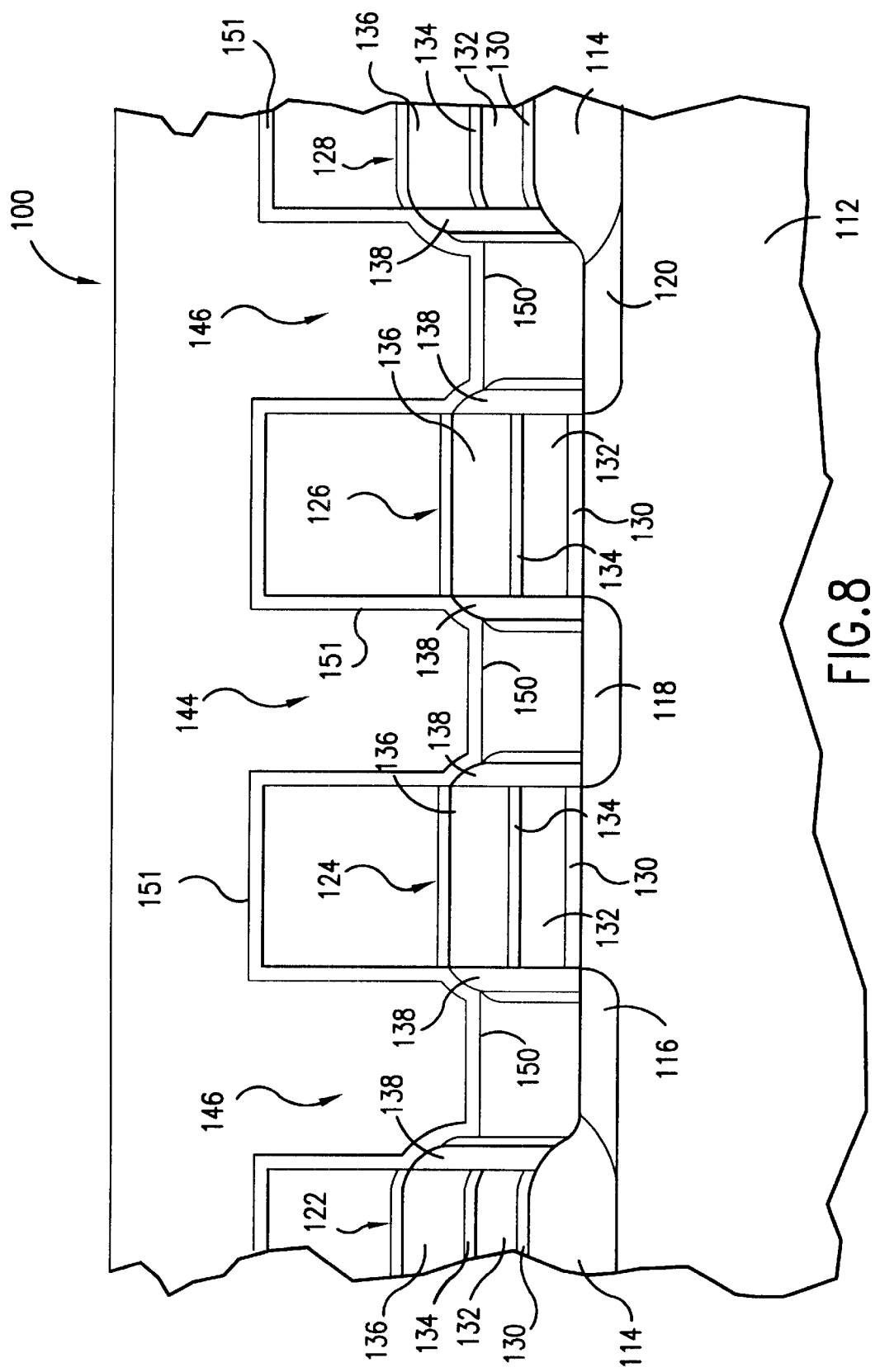
FIG. 8 is a diagrammatic cross-sectional view of a portion of a semiconductor wafer at a processing step subsequent to that shown in FIG. 7.

Referring now to FIG. 8, a thin barrier film 151 of a mixed metal boride, nitride or boride-nitride of the formula $M_xAl_yN_zB_w$ as defined above is formed as a barrier layer atop conductive layer 150. Barrier film 151 is preferably deposited by CVD to form a conformal layer which protects the subsequently deposited capacitor dielectric against diffusion from underlying plug 150 and other surrounding materials. Perhaps more importantly for some applications of the invention, barrier film 151 also protects the underlying plug 150 from diffusion of oxygen from the capacitor dielectric.

The preferred method for depositing barrier layer 15, includes positioning the wafer assembly within a vacuum CVD reactor chamber. In one preferred implementation, the CVD reactor will be a cold wall reactor. Preferably, the substrate will be heated by a resistive-type ceramic heater to a temperature of 250–550° C. Hydrogen gas will inlet to the chamber at a rate of approximately 50–500 sccm. Subsequently, the metal (M), aluminum, nitrogen, and boron precursors will be admitted into the CVD chamber. Preferably, if the metal (M) is Ti, the titanium precursor will be of the formula $Ti(NR_2)_4$, where R is selected from the group consisting of H an alkyl and/or aryl group. However, any suitable organometallic or inorganic titanium containing source may be substituted for $Ti(NR_2)_4$. In such case, the same gas will serve as both the titanium and nitrogen precursor. Most preferably, the titanium precursor will be a titanium organometallic precursor, having the formula $Ti(N(CH_3)_2)_4$, which is commonly referred to as TDMAT. The aluminum precursor will preferably be dimethylethylaminealane, commonly known as DMEAA. However, any suitable organometallic or inorganic aluminum containing source may be substituted for DMEAA. Both of these reaction precursors are liquids at room temperature, and must be bubbled with helium, or otherwise vaporized, such as through injection into a vaporizer to facilitate transport as gases into the CVD chamber for deposition on the substrate. Sources as precursors for Ti, Zr, Hf, V, Nb, Ta, Cr, Mo and W, can be any suitable metal halide or organometallic compound containing Ti, Zr, Hf, V, Nb, Ta, Cr, Mo or W.

In a particularly preferred CVD process according to the present invention, a bubbler will be used for each precursor, and each bubbler will be held at the same pressure as that within the CVD chamber. A TDMAT bubbler will preferably be maintained at a temperature of 35–55° C., with helium being flowed through at a rate of approximately 20–200 sccm. Simultaneously, the DMEAA vessel will be maintained at a temperature of approximately 5–30° C., with the helium passed through at a rate of 10–100 sccm. Other systems may be utilized for introducing one or more precursors into the CVD chamber. For example, in addition to the use of a vaporizer or evaporator, a precursor may be introduced into the CVD chamber by direct liquid injection. Additionally, although the use of gaseous precursors is currently preferred, precursors may be introduced in vapor or liquid form, such as in liquid source CVD (LSCVD) operations.

When deposition is to occur, the precursors are bubbled into the CVD chamber, and are mixed in a gas distributor, such as a gas "showerhead", and are directed onto the heated substrate. Deposition may be continued for the desired period of time. The metal, aluminum, nitrogen, and boron will thus preferably be deposited generally simultaneously, as an amorphous material. In one exemplary implementation, where the $M_xAl_yN_zB_w$ will be deposited upon a wafer, the deposition may continue for approximately 3–10 minutes, after which time the gas flows will be stopped, and the substrate allowed to cool.

Although the DMEAA precursor gas is described relative to the exemplary embodiment above, an aluminum precursor, aluminum alkyls or alkyl hydride compounds, or their Lewis-based adducts may also be utilized in their place. Other examples of acceptable aluminum precursors can be, but are not imited to, trimethylaluminum, tris (dimethylamino)aluminum, trimethylaminealane, dimethylalane, or (dimethylethylamine)dimethylalane.

Other examples of the exemplary products for titanium precursors are, but are not limited to: the ethyl analog of TDMAT, tetrakisdiethylamidotitanium (also conventionally known as TDEAT); bis(2,4dimethyl-1,3-pentadienyl) titanium (also conventionally known as BDPT); titanium tetrachloride; titanium tetrabromide; titanium tetraiodide; and cyclopentadienylcycloheptatrienyltitanium (also conventionally known as CpTiChT). Examples of exemplary products for other metal precursors include $CpZr(BH_4)_2$, $CpHf(BH_4)_2$, $TaCl_5$, $WF_6$, and $MoF_6$.

Examples of reactive gas sources for nitrogen and boron include, but are not limited to $NF_3$, $N_2$ (especially with plasma assist), $NH_3$, hydrazine, methyl hydrazine, $B_2H_6$, and $BCl_3$.

Figure 9:
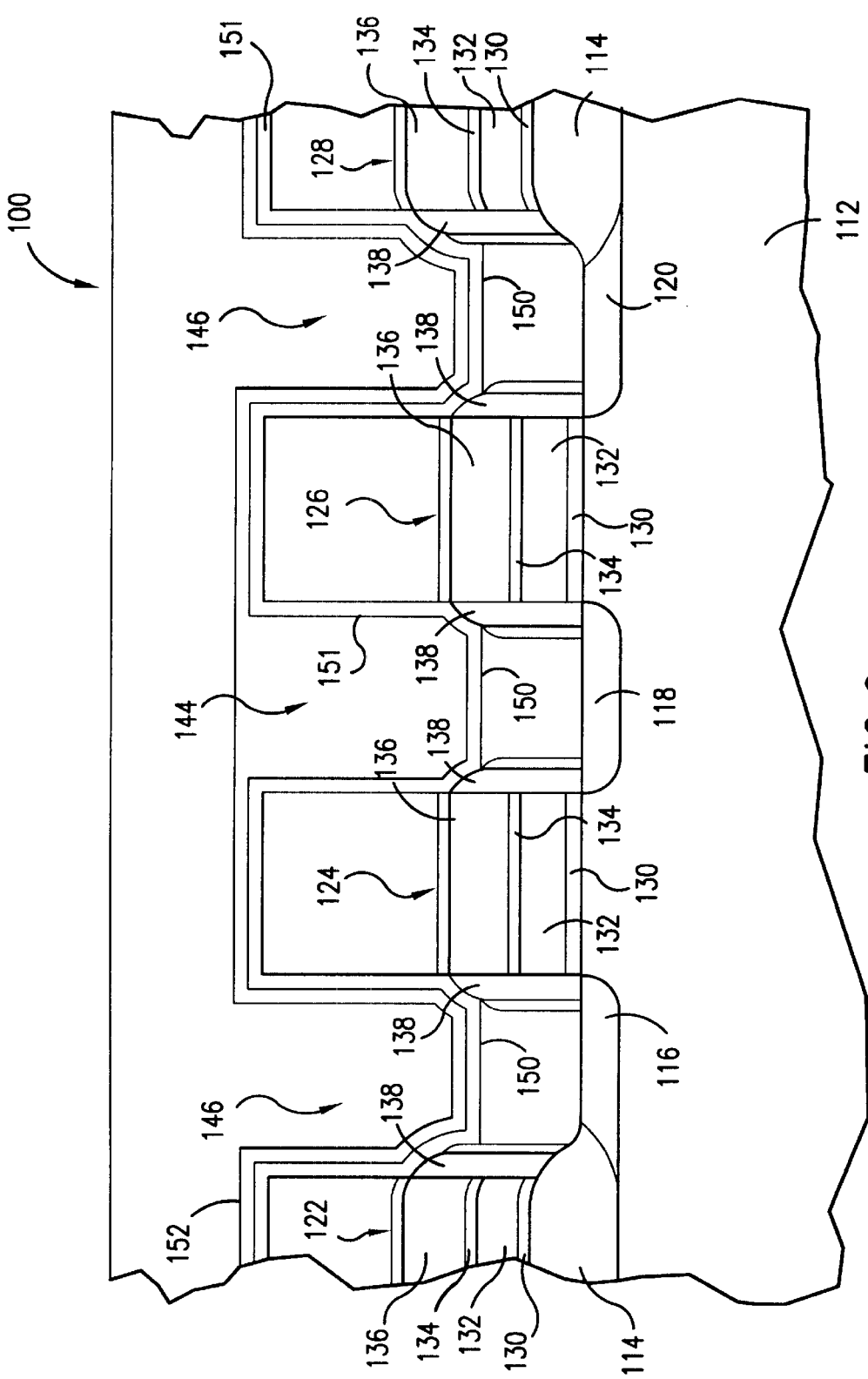
FIG. 9 is a diagrammatic cross-sectional view of a portion of a semiconductor wafer at a processing step subsequent to that shown in FIG. 8.

Following chemical vapor deposition of a mixed metal nitride and boride barrier film 151, a layer 152 of conductive material that will eventually form one of the electrodes of the capacitor is deposited at a thickness such that the capacitor openings 144, 146 are not closed off. Referring to FIG. 9, the layer 152 may be formed of various refractive metals, conductive metal oxides, metal nitrides, noble metals and may include, such as, Pt, Rh, Ir, Ru, Os, Pd, $IrO_2$, $RhO_2$, $RuO_2$, Ta, TiN, TaN, Ti and others. The conductive layer 152 is in electrical contact with the previously formed plugs 150 or, as previously mentioned, the $M_xAl_yN_zB_w$ layer will itself be the lower electrode.

Figure 10:
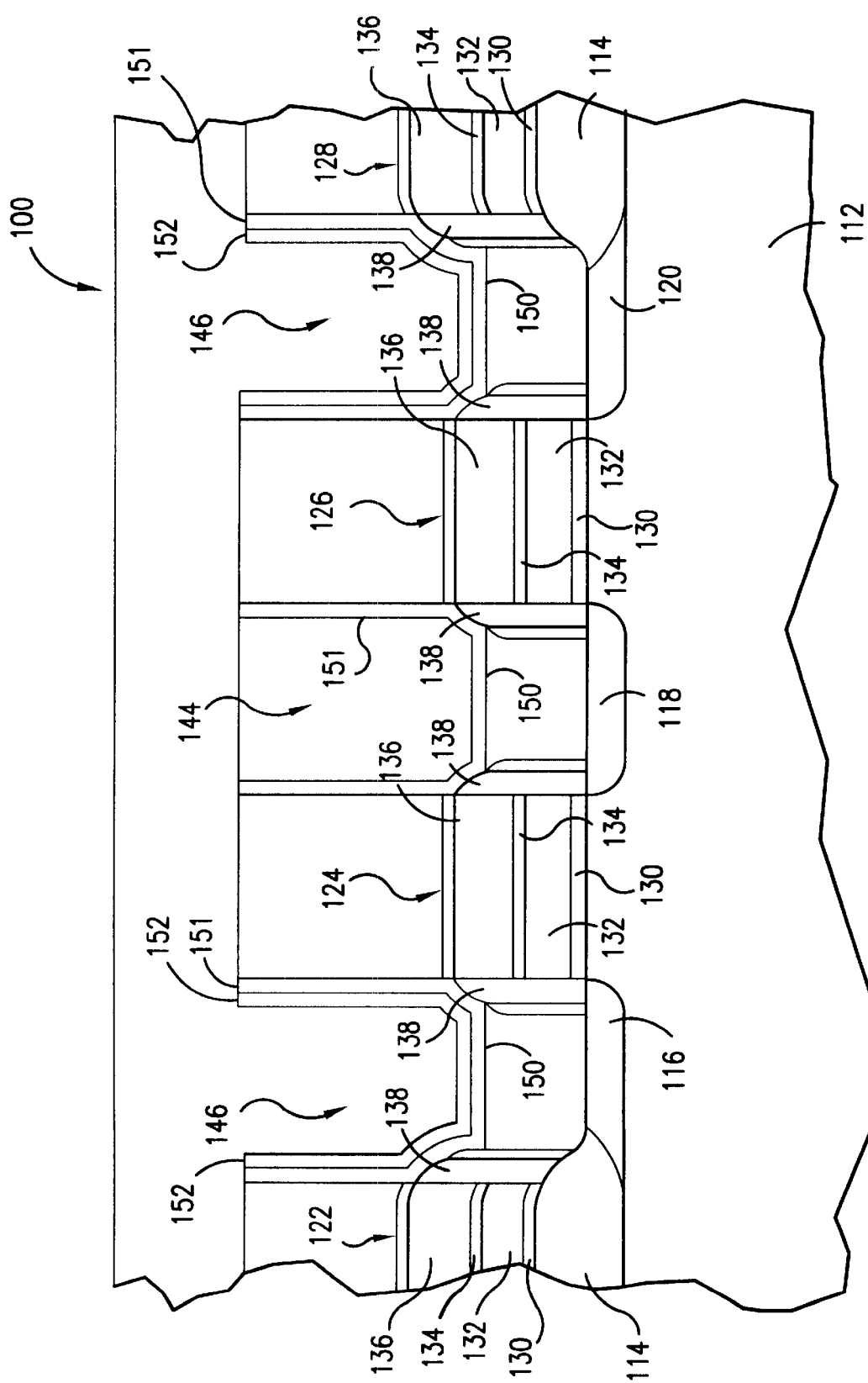
FIG. 10 is a diagrammatic cross-sectional view of a portion of a semiconductor wafer at a processing step subsequent to that shown in FIG. 9.
Figure 11:
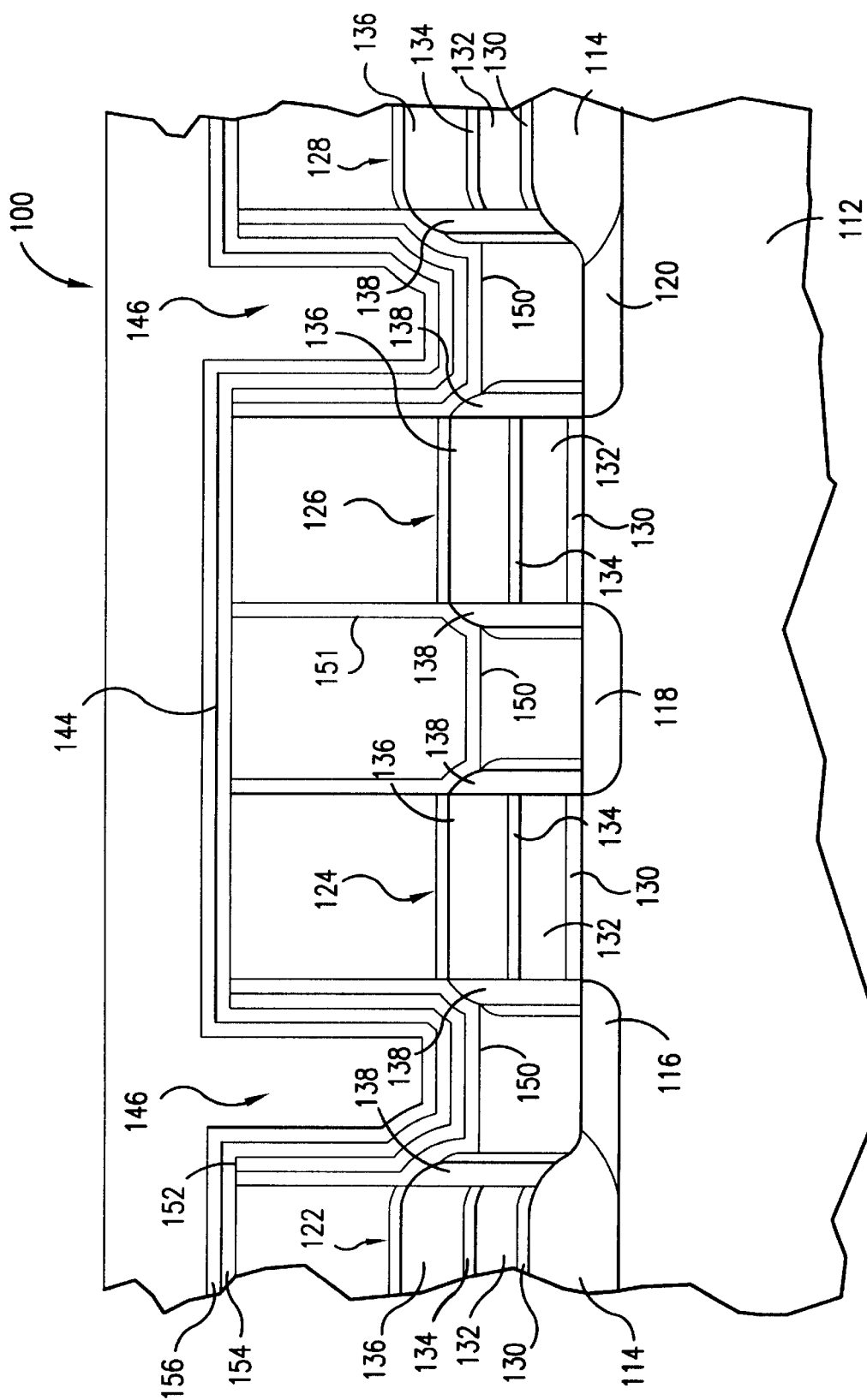
FIG. 11 is a diagrammatic cross-sectional view of a portion of a semiconductor wafer at a processing step subsequent to that shown in FIG. 10.

Referring to FIG. 10, the portion of the conductive layer 152 above the top of the BPSG layer 142 is removed through a planarized etching process, thereby electrically isolating the portions of layer 152 remaining in the bit line contact and capacitor openings 144, 146. Referring now to FIG. 11, a capacitor dielectric layer 154 is provided over conductive layer 152 and capacitor openings 144, 146.

Dielectric layer 154 is deposited with a thickness such that the openings 146 are again not completely filled. Dielectric layer 154 may comprise tantalum pentoxide ($Ta_2O_5$). Other suitable dielectric materials such as Strontium Titanate (ST), Barium Strontium Titanate (BST), Lead Zirconium Titanate (PZT), Strontium Bismuth Tantalate (SBT) and Bismuth Zirconium Titanate (BZT) may also be used. Dielectric layer 154 may be deposited by a low-pressure CVD process using $Ta(OC_2H_5)_5$ and $O_2$ at about 430° C., and may be subsequently annealed in order to reduce leakage current characteristics.

A second conductive electrode layer 156 is then deposited by CVD over the dielectric layer 154, again at a thickness which less than completely fills the capacitor openings 146. The second conductive layer 156 may be comprised of TiN, Pt, or other conventional electrode materials, such as many of those previously described for use as conductive layer 152. In addition to serving as the top electrode or second plate of the capacitor, the second conductive layer 156 also forms the interconnection lines between the second plates of all capacitors.

Figure 12:
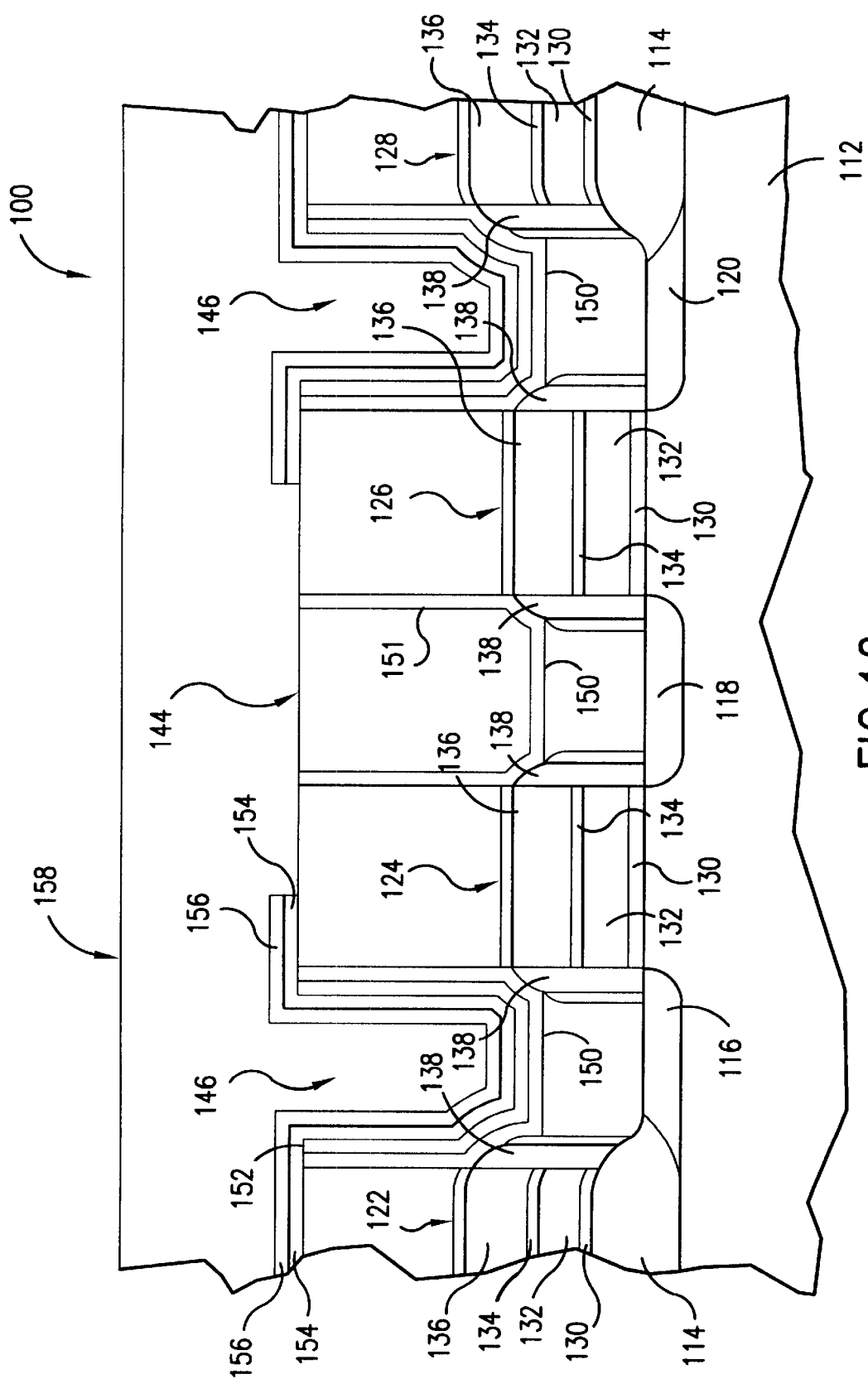
FIG. 12 is a diagrammatic cross-sectional view of a portion of a semiconductor wafer at a processing step subsequent to that shown in FIG. 11.

Referring to FIG. 12, the second conductive layer 156 and underlying capacitor dielectric layer 154 are patterned and etched such that the remaining portions of each group of the first conductive layer 152, capacitor dielectric layer 154, and second conductive layer 156 over the bit line contact and capacitor openings 144, 146 are electrically isolated from each other. In this manner, each of the active areas 116, 118, 120 are also electrically isolated (without the influence of the gate). Furthermore, a portion of the first conductive layer 152 in contact with the plug 150 over the bit line active area 118 is outwardly exposed.

Referring now to FIG. 12, a bit line insulating layer 158 is provided over the second conductive layer 156 and into the bit line contact opening 144. The bit line insulating layer 158 is preferably comprised of BPSG. The BPSG is typically reflowed by conventional techniques, i.e., heating to about 800° C. Other insulating layers such as PSG, or other compositions of doped $SiO_2$ may similarly be employed as the insulating layer 158.

Figure 13:
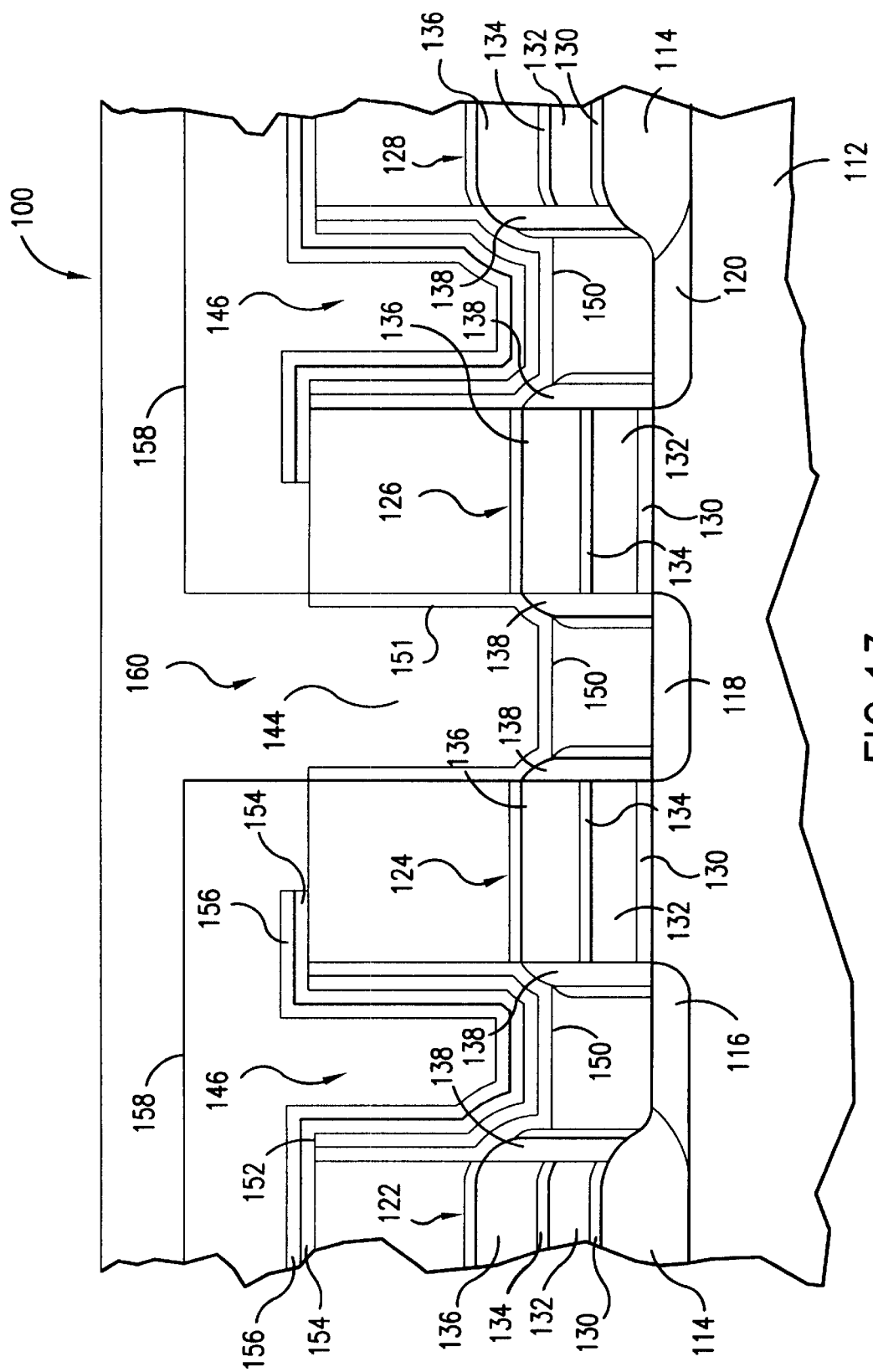
FIG. 13 is a diagrammatic cross-sectional view of a portion of a semiconductor wafer at a processing step subsequent to that shown in FIG. 12.

Referring to FIG. 13, a bit line contact opening 160 is patterned through the bit line insulating layer 158 such that the barrier film 151 above plug conductive layer 150 is once again outwardly exposed. Then a bit line contact is provided in the bit line contact opening 160 such that the bit line contact is in electrical contact with the outwardly exposed portion of the barrier film 151 above conductive plug layer 150. Thus, the plug 150 over the active area 118 common to both FETs acts as a bit line contact. The DRAM array and associated circuitry may then be completed by a variety of well established techniques, such as metalization, and attachment to peripheral circuitry.

Figure 14:
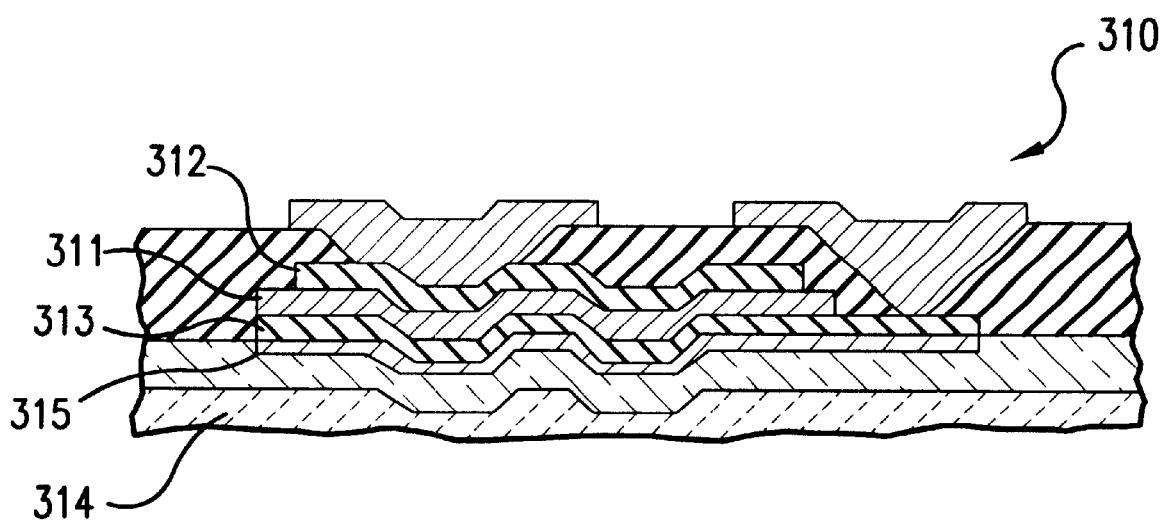
FIG. 14 is a diagrammatic cross-sectional view taken along a portion of a semiconductor wafer at a processing step according to another embodiment of the present invention.

Another specific example of where a film formed from the $M_xAl_yN_zB_w$ materials of the present invention is useful is the ferroelectric memory cell 310 of FIG. 14. The memory cell 310 includes a ferroelectric material 311, which is prepared by depositing one or more of the materials discussed herein preferably using chemical vapor techniques, between two electrodes 312 and 313, which are typically made of platinum, although other metals such as gold or aluminum can also be used. The bottom electrode 313 is typically in contact with a silicon-containing layer 314, such as an n-type or p-type silicon substrate, silicon dioxide, glass, etc. A conductive mixed metal nitride and boride barrier layer 315, preferably deposited by CVD, is positioned between the bottom electrode 313 and the silicon-containing layer 314 to act as a barrier layer to diffusion of atoms such as silicon into the electrode and ferroelectric material.

Figure 15:
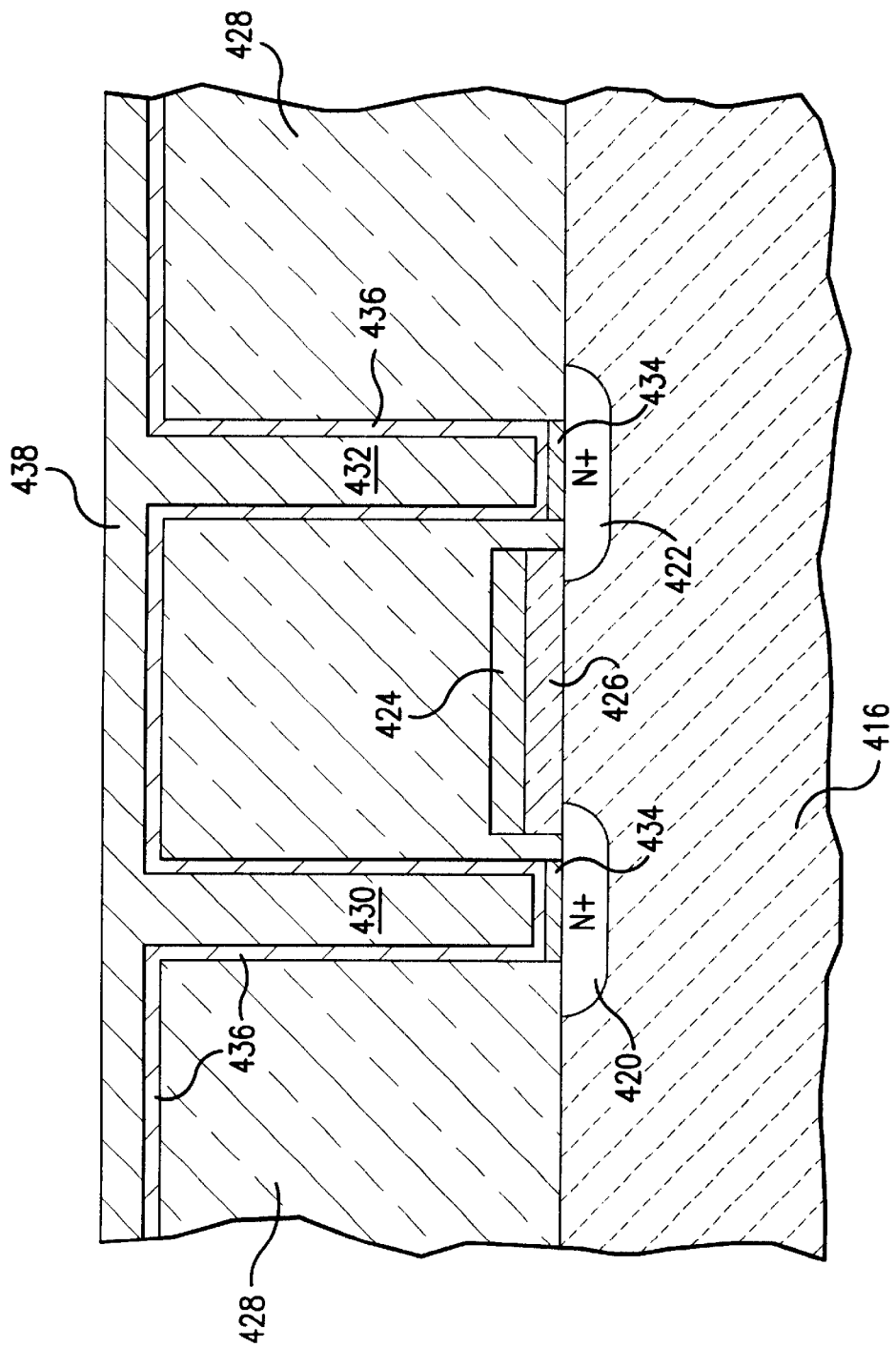
FIG. 15 is a diagrammatic cross-sectional view taken along a portion of a semiconductor wafer at processing step according to still another embodiment of the present invention.

Yet another specific example of where a film formed from the material of the present invention is useful is the structure shown in FIG. 15. The substrate 416 may be in the form of an n-channel MOSFET (n-channel metal-oxide semiconductor field-effect transistor), which may be used in a DRAM memory device. As shown, substrate 416 is a p-type silicon having two n-type silicon islands 420 and 422, representing the transistor source and drain. Such a construction is well known. The gate for the transistor is formed by a metal/polysilicon layer 424 deposited over a silicon dioxide layer 426. A relatively thick layer of an insulating silicon dioxide 428 overlies the active areas on substrate 416.

To connect the MOSFET of FIG. 15 with conductive paths on the surface of the device, contacts 430 and 432 have been etched through oxide layer 428 down to the surface of substrate 416. A metal or metal silicide layer 434, such as titanium silicide, is deposited and formed at the base of contacts 430 and 432. A thin, conformal barrier layer of a mixed metal boride and nitride 436 is deposited by CVD over the walls of the contacts. Because of the presence of the conductive barrier layer, the electrical contact path is excellent and the aluminum metal 438 which is deposited over the mixed metal boride and nitride barrier layer 436 is prevented from attacking the substrate surfaces.

Figure 16:
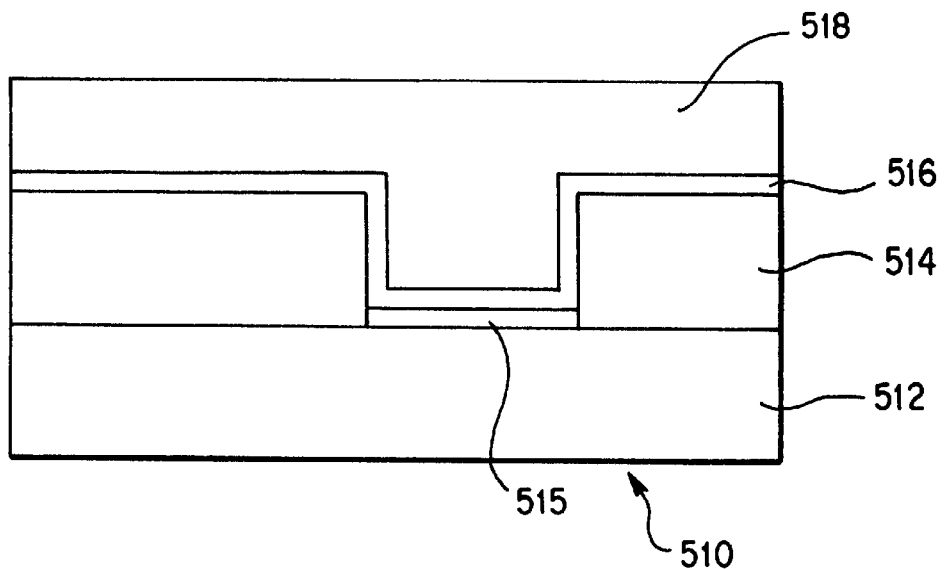
FIG. 16 is a diagrammatic cross-sectional view taken along a portion of a semiconductor wafer at processing step according to yet a further embodiment of the present invention.
Figure 17:
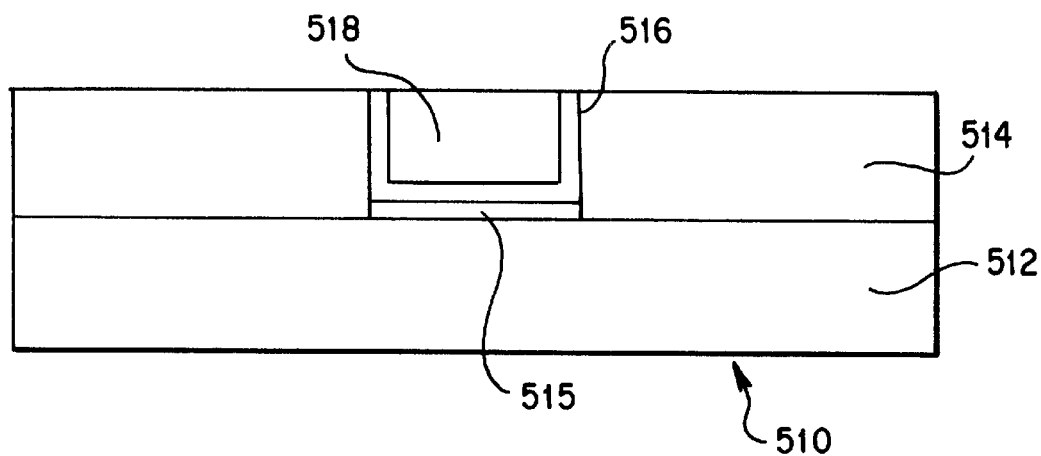
FIG. 17 is a diagrammatic cross-sectional view of a portion of a semiconductor wafer at a processing step subsequent to that shown in FIG. 16.

In still another example, as depicted in FIG. 16, after deposition of the $M_xAl_yN_zB_w$ barrier layer 516 within the opening within layer 514, a conductive layer 518 may be deposited to fill the cavity formed in layer 514 over the substrate contact region 515. Conductive layer 518 may be, for example, aluminum or tungsten. Subsequently, layers 516 and 518 may removed, such as by being patterned and etched in a desired manner to form interconnects between substrate regions. Alternatively, conductive layer 518 and barrier layer 516 could be etched away to form a conductive plug structure as shown in FIG. 17.

The mrixed-metal nitride and boride barrier layer and electrode materials according to the invention have excellent conductivity, and therefor reduce depletion effects and enhance frequency response. The materials possess excellent barrier properties for protection of cell dielectrics and substrate during oxidation/recrystallization steps for dielectrics and during BPGS reflow and other high temperature steps after capacitor formation. In addition, the barriers according to the invention also substantially prevent diffusion to protect cell dielectrics from interaction with Si and other surrounding materials which may degrade the dielectric materials or produce an additional $SiO_2$ dielectric layer. Thus, the barriers/electrodes of the invention are not limited to use as barrier films for bottom electrodes, but may also be employed both as top and bottom electrodes, and as additional barrier layers applied to any other top and/or bottom electrodes. The compositions and methods of forming barrier films of the present invention are also beneficial for a wide variety of thin film applications in integrated circuit structures, particularly those using high dielectric materials and/or silicon-metal interfaces. The method of the preferred embodiments of the invention prevent degradation of an electrical connection between a conductive layer and a semiconductor substrate by providing a diffusion barrier between the two regions.

Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A semiconductor device comprising:
    a substrate comprising silicon;
    a diffusion barrier layer over said substrate, said diffusion barrier layer comprising aluminum, a metal selected from the group consisting of Ti, Zr, Hf, V, Nb, Ta, Cr, Mo and W, and also comprising N and B; and
    a layer of dielectric material on said diffusion barrier, said dielectric material comprising a material selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

2. A semiconductor device as in claim 1 and further comprising a layer of metal on said diffusion barrier layer.

3. A semiconductor device as in claim 2 wherein said layer of metal comprises a metal selected from the group consisting of Al and W.

4. A semiconductor as in claim 1 wherein said metal is selected from the group consisting of Ti, Zr, Hf; Ta and Nb.

5. A semiconductor device as in claim 4 wherein said diffusion barrier layer comprises a material having the formula $M_xAl_yN_zB_w$, wherein M is said metal and x+y=1, and z+w/2=1.

6. A semiconductor device as in claim 1 wherein said metal is selected from the group consisting of Mo and W.

7. A semiconductor device as in claim 6 wherein said diffusion barrier layer comprises a material having the formula $M_xAl_yN_zB_w$, wherein M is said metal and x+y=1, and z+2w=1.

8. A semiconductor device as in claim 4 wherein said diffusion barrier comprises a material having the formula $M_{0.7}Al_{0.3}N_{0.3}B_{14}$, wherein M is said metal.

9. A semiconductor device as in claim 6, wherein said diffusion barrier layer comprises a material having the formula $M_{0.7}Al_{0.3}N_{0.3}B_{0.35}$, wherein M is said metal.

10. A diffusion barrier located between a siihcon substrate and a metal film in a semiconductor device, said diffusion barrier comprising:
    a mixed metal boron-nitride layer formed on said film and having the formula $M_xAl_yN_zB_w$, wherein M is Ti, Zr, Hf. V, Nb, Ta, Cr, Mo, or W; wherein x+y=1, and either z+w/2=1 or z+2w=1.

11. A diffusion barrier as in claim 10 wherein M is Ti, and w is greater than 0.

12. A diffusion barrier as in claim 10 wherein said layer of metal comprises a metal selected from the group consisting of Al and W.

13. A diffuision barrier as in claim 10 wherein M is a metal selected from the group consisting of Ti, Zr, Hf; Ta and Nb.

14. A diffusion barrier as in claim 10 wherein M is a metal selected from the group consisting of Mo and W.

15. A diffision barrier as in claim 13 wherein said diffusion barrier has the formula $M_{0.7}Al_{0.3}N_{0.3}B_{1.4}$.

16. A diffusion barrier as in claim 14, wherein said diffusion barrier has the formula $M_{0.7}Al_{0.3}N_{0.3}B_{0.35}$.

17. A capacitor, comprising a first electrode layer, a dielectric layer, and a second electrode layer, said dielectric layer separating said first and second electrode layers wherein at least one of said first and second electrode layers comprises a material having the formula $M_xAl_yN_zB_w$, wherein M is Ti, Zr, Hf, V, Nb, Ta, Cr. Mo, or W; wherein x+y=1, and either z+w/2=1 or z+2w=1.

18. The capacitor of claim 17 wherein said dielectric layer is selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

19. The capacitor of claim 17 wherein said at least one $M_xAl_yN_zB_w$ electrode layer comprises a diffusion barrier for said capacitor.

20. The capacitor of claim 19 wherein said diffusion barrier is below the bottom electrode of said capacitor.

21. The capacitor of claim 17 wherein said at least one $M_xAl_yN_zB_w$ electrode layer is a bottom electrode of said capacitor.

22. A capacitor as in claim 17 wherein M is a metal selected from the group consisting of Ti, Zr, Hf, Ta and Nb.

23. A capacitor as in claim 17 wherein M is a metal selected from the group consisting of Mo and W.

24. A capacitor as in claim 17 wherein M is Ti and W is greater than zero.

25. A capacitor as in claim 22 wherein said at least one conductive layer comprises a material having the formula $M_{0.7}Al_{0.3}N_{0.3}B_{14}$.

26. A capacitor as in claim 23, wherein said at least one conductive layer comprises a material having the formula $M_{0.7}Al_{0.3}N_{0.3}B_{0.35}$.

27. The capacitor of claim 17 wherein said dielectric layer comprises $Ta_2O_5$.

28. The capacitor of claim 17 wherein said capacitor is a container capacitor.

29. A capacitor, comprising a dielectric layer between a first conductive layer and a second conductive layer, and a conductive barrier layer between one of said first and second conductive layers and said dielectric layer, said conductive barrier layer containing a material having the formula $M_xAl_yN_zB_w$, wherein M is Ti, Zr, Hf, V, Nb, Ta, Cr, Mo, or W; wherein x+y=1, and either z+w/2=1 or z+2w=1.

30. The capacitor of claim 29, wherein said dielectric layer is selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

31. The capacitor of claim 29 wherein said second conductive layer comprises an electrode for said capacitor and said barrier layer is interposed between said dielectric and said second conductive layer.

32. The capacitor of claim 29 wherein said first conductive layer comprises an electrode for said capacitor and said barrier layer is interposed between said dielectric and said first conductive layer.

33. The capacitor of claim 29 wherein said dielectric layer comprises a material selected from the group consisting of $Ta_2O_5$ and $(Ba, Sr)TiO_3$.

34. The capacitor of claim 29 wherein said capacitor is a container capacitor.

35. An integrated circuit comprising a capacitor, said capacitor comprising a first electrode, a dielectric layer, and a second electrode, at least one of said first and second electrodes comprising a material having the formula $M_xAl_yN_zB_w$, wherein M is Ti, Zr, Hf, V, Nb, Ta, Cr, Mo, or W; x is greater than zero; y is greater than zero; and z and w are greater than zero.

36. The integrated circuit of claim 35 wherein said dielectric layer is selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

37. The integrated circuit of claim 35 wherein said at least one of said first and second electrodes is a bottom electrode for said capacitor.

38. The integrated circuit of claim 35 wherein said dielectric layer comprises a material selected from the group consisting of $Ta_2O_5$ and $(Ba,Sr)TiO_3$.

39. The integrated circuit of claim 35 wherein said capacitor is a container capacitor.

40. The integrated circuit of claim 35, wherein the circuit is a memory circuit.

41. The integrated circuit of claim 35, wherein the circuit is a dynamic random access memory circuit. han zero.

* * * * *

UNITED STATES PATENT AND TRADEMARK OFFICE
CERTIFICATE OF CORRECTION

PATENT NO. : 6,445,023 B1
DATED : September 3, 2002
INVENTOR(S) : Brian A. Vaartstra et al.

It is certified that error appears in the above-identified patent and that said Letters Patent is hereby corrected as shown below:

<u>Column 1,</u>
Line 20, "interdiffisse" should read -- interdiffuse --.

<u>Column 10,</u>
Line 20, "siihcon" should read -- silicon --.

<u>Column 12,</u>
Line 27, "circuit. Han zero" should read -- circuit --.

Signed and Sealed this

Seventeenth Day of June, 2003

JAMES E. ROGAN
*Director of the United States Patent and Trademark Office*